(12) United States Patent
Goldenbaum et al.

(10) Patent No.: US 12,313,697 B2
(45) Date of Patent: May 27, 2025

(54) TESTING OF AN ELECTRICAL SYSTEM OF A WIND TURBINE

(71) Applicant: Siemens Gamesa Renewable Energy A/S, Brande (DK)

(72) Inventors: Nikolaus Goldenbaum, Ry (DK); Jan Thisted, Tjele (DK)

(73) Assignee: SIEMENS GAMESA RENEWABLE ENERGY A/S, Brande (DK)

( * ) Notice: Subject to any disclaimer, the term of this patent is extended or adjusted under 35 U.S.C. 154(b) by 155 days.

(21) Appl. No.: 18/013,982

(22) PCT Filed: Jul. 2, 2021

(86) PCT No.: PCT/EP2021/068307
§ 371 (c)(1),
(2) Date: Dec. 30, 2022

(87) PCT Pub. No.: WO2022/008367
PCT Pub. Date: Jan. 13, 2022

(65) Prior Publication Data
US 2023/0288494 A1    Sep. 14, 2023

(30) Foreign Application Priority Data
Jul. 10, 2020 (EP) .................................... 20185261

(51) Int. Cl.
  *G01R 31/42* (2006.01)
  *F03D 9/25* (2016.01)
  *F03D 17/00* (2016.01)

(52) U.S. Cl.
  CPC .............. *G01R 31/42* (2013.01); *F03D 9/25* (2016.05); *F03D 17/00* (2016.05); *F05D 2220/76* (2013.01)

(58) Field of Classification Search
CPC . G01R 31/42; F03D 9/25; F03D 17/00; F03D 9/255; F05D 2220/76; Y02E 10/72
See application file for complete search history.

(56) References Cited

U.S. PATENT DOCUMENTS

| | | | |
|---|---|---|---|
| 2007/0138796 A1* | 6/2007 | Hornemann | G01R 31/34 290/44 |
| 2013/0300116 A1* | 11/2013 | Egedal | H02P 21/05 290/55 |

(Continued)

FOREIGN PATENT DOCUMENTS

| | | | |
|---|---|---|---|
| CN | 106324415 A * | 1/2017 | ........... G01R 31/026 |
| CN | 106324415 B | 8/2019 | |

(Continued)

OTHER PUBLICATIONS

Fabio, Luise et al: "Regenerative Testing of a Concentrated-Winding Permanent-Magnet Synchronous Machine for Offshore Wind Generation Part I: Test Concept and Analysis"; IEEE Transactions on Industry Applications; IEEE Service Center; Piscataway; NJ; US; vol. 48; No. 6; Nov. 1, 2012 ; pp. 1779-1790; XP011484790; ISSN: 0093-9994; DOI: 10.1109/TIA.2012.2221072.

(Continued)

*Primary Examiner* — Lee E Rodak
*Assistant Examiner* — Demetrius R Pretlow
(74) *Attorney, Agent, or Firm* — Schmeiser, Olsen & Watts LLP

(57) ABSTRACT

A method of testing an electrical system of a wind turbine that includes at least one power converter coupled to a generator. The power converter is operable in a power generating mode in which the power converter provides a conversion of electrical power generated by the generator and provides a controllable output of AC electrical power towards a power grid. The method includes operating the wind turbine in a testing mode. Operation in the testing (Continued)

mode includes decoupling the electrical system to be tested from the power grid, operating the power converter as a test condition generator, supplying electrical power to the test condition generator, converting, by the test condition generator, the received electrical power to generate predetermined electrical test conditions, and exposing the electrical system to be tested to the predetermined electrical test conditions. The test condition generator controls one or more electrical characteristics of the electrical test conditions.

15 Claims, 7 Drawing Sheets

(56) References Cited

U.S. PATENT DOCUMENTS

| | | | | |
|---|---|---|---|---|
| 2015/0184642 A1* | 7/2015 | Mohan | ............... | F03D 17/00 290/44 |
| 2016/0084234 A1* | 3/2016 | De Bauw | ............... | F03D 7/048 702/41 |
| 2017/0122291 A1* | 5/2017 | Barker | ............... | G05B 23/0278 |
| 2017/0229907 A1* | 8/2017 | Hoffmann | ............... | H02P 9/007 |
| 2021/0341523 A1* | 11/2021 | Schwanka Trevisan | ............... | H02J 3/381 |

FOREIGN PATENT DOCUMENTS

| | | |
|---|---|---|
| EP | 2848804 A1 | 3/2015 |
| EP | 3480610 A1 | 5/2019 |
| EP | 3651304 A1 | 5/2020 |
| WO | 2017036836 A1 | 3/2017 |

OTHER PUBLICATIONS

Shen, Jie et al: "A High-Performance 2x27 MVA Machine Test Bench Based on Multilevel IGCT Converters"; IEEE Transactions on Industry Applications; IEEE Service Center; Piscataway; NJ; US; vol. 51, No. 5; Sep. 1, 2015; pp. 3877-3889; XP011669071; ISSN: 0093-9994; DOI: 10.1109/TIA.2015.2422822.

International Search Report and the Written Opinion of the International Searching Authority issued on Oct. 12, 2021 for application No. PCT/EP2021/068307.

* cited by examiner

TESTING OF AN ELECTRICAL SYSTEM OF A WIND TURBINE

CROSS-REFERENCE TO RELATED APPLICATIONS

This application claims priority to PCT Application No. PCT/EP2021/068307, having a filing date of Jul. 2, 2021, which claims priority to EP Application No. 20185261.3, having a filing date of Jul. 10, 2020, the entire contents both of which are hereby incorporated by reference.

FIELD OF TECHNOLOGY

The following relates to a method of testing an electrical system of a wind turbine, to a test system that is configured to perform a respective testing of the electrical system, and to a computer program for performing such testing.

BACKGROUND

The number of wind turbines that provide electrical power to a power grid continuously increases. The requirements for connecting such wind turbines to a power grid are therefore becoming more and more demanding, as grid stability has to be ensured also when a plurality of wind turbines provide electrical power into the grid. Wind turbines therefore have to undergo stringent testing, which for example includes testing for compatibility with normal and abnormal voltage, frequency and harmonic distortion conditions, normal operating range harmonic emissions, normal operating range performance of active power, voltage and reactive power control and appropriately responding to abnormal grid conditions, such as low voltage ride through (LVRT) and high voltage ride through (HVRT).

To demonstrate that a new wind turbine meets these requirements, tests and measurements are typically performed on the first prototype of a new wind turbine. External testing equipment is connected to the wind turbine at a testing site to perform these tests. Turbine level system tests in relation to abnormal frequency and voltage, rate of change of frequency (ROCOF), and phase jumps are for example performed in a full nacelle test rig. Such tests of the wind turbine are resource and time consuming and are therefore generally performed only during a first turbine validation phase.

However, as developments progress, wind turbines are now often upgraded, for example by adding or exchanging mechanical and/or electrical components, feature changes, changes to the control of the turbine and the like. Also such an upgraded wind turbine has to meet the stringent grid code requirements, which can however not easily be validated. Some tests are difficult to perform, for example frequency testing, as the wind turbine, once installed, is connected to the power grid which is operated at a constant frequency. To perform such testing, a nacelle lift-off would be a possibility in which the whole wind turbine nacelle is removed from the wind turbine tower and is connected to respective test equipment at a testing site to allow the performing of the necessary tests and validation. Such testing would however be labor and cost intensive and technically challenging, so that it is not practically feasible. It is therefore not possible to perform tests related to frequency changes, ROCOF or phase jump events after the upgrading of the wind turbine. LVRT testing has been performed in the past using test containers filled with coils for providing the necessary HV electrical power for the testing, which requires the providing of such large scale testing equipment at the testing site.

Document EP 3 651 304 A1 is related to a method for performing a testing procedure of an electrical power system for a wind turbine by means of a power supply unit. Thereby, all components of the electrical power system are provided—loaded—with their rated voltage and it is possible to perform inspection of the various electrical components of the electrical power system.

Document WO 2017/036836 A1 is related to a method for testing a wind turbine. At least one wind turbine to be tested is connected to an island grid, which is supplied by at least one grid emulating wind turbine. The at least one grid emulating wind turbine is controlled such that a test scenario is produced in the island grid to simulate a utility grid with a specific fault scenario.

SUMMARY

Accordingly, there is a need to mitigate at least some of the drawbacks mentioned above and to improve the testing of wind turbine electrical systems, in particular to make such testing less complex and more efficient.

According to an embodiment, a method of testing an electrical system of a wind turbine is provided. The wind turbine comprises at least one power converter coupled to a generator of the wind turbine. The at least one power converter, and in particular the wind turbine, is operable in a power generating mode in which the power converter provides a conversion of electrical power generated by the generator and provides a controllable output of AC electrical power towards a power grid. The method comprises operating the wind turbine in a testing mode. Such operation in the testing mode includes the performing of the steps of: decoupling the electrical system to be tested from the power grid; operating the at least one power converter as a test condition generator; supplying electrical power to the test condition generator; converting, by the test condition generator, the received electrical power to generate predetermined electrical test conditions, and exposing the electrical system to be tested to the predetermined electrical test conditions, wherein the test condition generator controls one or more electrical characteristics of the electrical test conditions.

By means of such method, it becomes possible to test the electrical system of the wind turbine comprehensively without requiring external equipment for generating the test conditions. It is rather sufficient to employ conventional measurement equipment to measure the response of the electrical system to the test conditions. Furthermore, the testing can be performed in a wind turbine that is already installed and grid connected, and no removal of the nacelle of such a wind turbine is necessary for testing. The power converter is thus essentially employed and operated as a "laboratory signal generator" that allows the performing of a wide variety of tests on the electrical system. Electrical performance testing may in particular be performed. The wind turbine may in particular be a grid connected wind turbine that is fully operational, it may for example be an offshore wind turbine.

In an embodiment, the test condition generator converts the received electrical power into AC electrical power. The test condition generator may control the one or more electrical characteristics of the electrical test conditions by operating as an AC power source and controlling one or more electrical characteristics of the converted (output) AC electrical power, and/or by operating as an AC load and controlling one or more load characteristics. The test condition generator may for example receive the electrical power from the wind turbine generator or from another, e.g. external, system and provide the converted AC electrical power in a direction towards the power grid, thus providing test conditions for electrical components of the wind turbine connected downstream of the converter output. The test condition generator may also be operated in a reverse direction, i.e. receiving electrical power from the grid side part of the electrical system and providing the converted AC electrical power to the generator to drive the generator, thus constituting a load on the grid side part of the wind turbine electrical system. The test condition generator may thus simulate certain electrical conditions on this grid side part of the wind turbine's electrical system, such as a voltage dip, over-currents and the like.

The at least one power converter may in particular be an AC-to-AC converter. When operating as a test condition generator, the at least one power converter may in particular operate in a variable voltage variable frequency (VVVF) mode of operation in which the output voltage and output frequency are controlled, in particular in accordance with the electrical test conditions to be generated.

The one or more electrical characteristics of the electrical test conditions may include one or a combination of an AC frequency, an AC voltage magnitude, an AC current magnitude, a phase angle of an AC voltage and/or AC current, a rate of change of an AC frequency, a magnitude of one or more harmonic distortions (e.g. one or a combination of different order harmonics) and a phase angle of one or more harmonic distortions. Comprehensive testing of the wind turbine's electrical system may thus be performed.

The electrical power may be supplied to the test condition generator by generating the electrical power using the generator of the wind turbine, by a turbine energy support system (TESS) that comprises an energy storage device, or by an external power system (such as a battery, a Diesel-generator or the like).

For example, the electrical power may be supplied to the test condition generator by generating the electrical power using the generator of the wind turbine, wherein the generator is rotated by receiving rotational mechanical energy from a rotor of the wind turbine, or wherein the generator is rotated by electrical power received from the power grid via a further electrical power converter connected in parallel to the test condition generator to the generator of the wind turbine. In the former case, the wind turbine can completely be decoupled from the power grid and thus be tested independently. Sufficient power for testing is then provided by the energy extracted from the wind.

In the latter case, the testing can likewise be performed independently of the power grid, since the test condition generator receives the electrical power from the rotating generator of the wind turbine, wherein the electrical system to be tested is decoupled from the grid. The further electrical power converter may for example be connected to windings of the generator that are different from the windings to which the test condition generator is connected. The further electrical power converter can then operate the generator as a motor, i.e. the generator receives electrical power from the further converter and a positive torque is applied that rotates the generator. The test condition generator then acts as a load on the generator and applies a negative torque, wherein steady state testing conditions can be achieved by adjusting the power output of the further converter. Only the electrical system to be tested and the test condition generator may thus be decoupled from the power grid, whereas the wind turbine transformer and the further converter remain connected to the power grid. A switch between the wind turbine transformer and the test condition generator may for example be opened, such as a low voltage (LV) circuit breaker associated with the first power converter.

The decoupling may include the decoupling of the test condition generator from the power grid. The decoupling comprises the opening of a switch between a transformer of the wind turbine and the power grid. Thereby, the whole wind turbine is disconnected from the power grid. Such decoupling may occur by opening a respective circuit breaker or by opening a respective (medium voltage/high voltage) switch gear.

In an embodiment, the method further comprises starting the wind turbine in the testing mode by obtaining electrical power from a power source which is for example the power grid, a TESS system of the wind turbine, or an external power source (e.g. battery bank or Diesel-generator); starting-up the wind turbine by means of the obtained electrical power and controlling a rotational speed of a rotor of the wind turbine such that electrical power to operate the wind turbine is generated by the generator of the wind turbine; if the wind turbine is coupled to the power grid, decoupling the wind turbine from the power grid, thereby decoupling the electrical system to be tested from the power grid; and supplying the electrical power generated by the generator to the test condition generator. If the initial power is not supplied from the power grid, the wind turbine may already be decoupled from the power grid prior to start-up of the wind turbine. After the electrical power is supplied to the test condition generator, the test conditions are generated as outlined above. The wind turbine may thus be started in the testing mode and may in particular not require any further grid connection for performing the testing.

The electrical system of the wind turbine to be tested may in particular include a part of a power generating system of the wind turbine, in particular a part of the electrical drive train of the wind turbine.

The electrical system to be tested may comprise one or a combination of wind turbine components selected from the group comprising or consisting of: a wind turbine auxiliary system, a wind turbine transformer, circuit breakers or relays of the wind turbine electrical system, an electrical power converter of the electrical drive train, a TESS system, a wind turbine protection system, a wind turbine auxiliary power supply, a wind turbine motor (such as a motor of a yaw drive, a blade pitch drive or the like), and a wind turbine pump (e.g. a lubrication pump or the like). For example, at least the wind turbine auxiliary system, or the auxiliary system and the transformer may be tested and may form part of the electrical system to be tested. Further, the electrical system to be tested may include at least a further power converter, for example the auxiliary system, the transformer and a further power converter. The components can be tested simultaneously, for example if they are connected in their normal way to an output of the test condition generator, they may for example form part of the electrical system exposed to the test conditions. Components may also be tested subsequently, for example by first performing a test that includes the wind turbine auxiliary system and the wind turbine transformer, and later performing a test that includes a further power converter.

The method may further comprise monitoring a response of the electrical system to be tested to the electrical test conditions. It may thus be determined if the electrical system meets the applicable requirements, such as the grid code requirements, and the wind turbine system may be validated.

The method may further include installing measurement equipment on the electrical system to be tested to monitor such response of the electrical system.

In an embodiment, the test condition generator is operated in accordance with a testing protocol. The testing protocol determines a setting of or changes to the one or more electrical characteristics of the electrical test conditions. The testing protocol may for example specify different tests according to which different parameters of the test conditions are set and/or varied.

Exposing the electrical system to be tested to the predetermined electrical test conditions may comprise the performing of at least one of the following tests: A frequency range test according to which the electrical test conditions comprise an AC voltage, the AC frequency of which is varied by the test condition generator around a nominal operating frequency of the electrical system to be tested. The nominal frequency may for example be 50 Hz or 60 Hz, and the AC electrical power provided by the test condition generator may have a frequency that deviates from this nominal frequency in order to test the performance of the electrical system under these conditions. A voltage range test according to which the electrical test conditions comprise an AC voltage, the magnitude of which is varied by the test condition generator around a nominal operating voltage of the electrical system to be tested. The reaction to certain undervoltage and overvoltage conditions may thus be measured. A phase jump test according which the electrical test conditions comprise the exposure of the electrical system to an AC voltage and/or AC current a phase angle of which is varied by the test condition generator, for example by introducing a phase jump. A phase jump is a sudden change in phase, phase jumps up to 30 degrees may for example be tested. A frequency change rate test according to which the electrical test conditions comprise an AC voltage the rate of change of an AC frequency of which is varied by the test condition generator. The reaction to faster or slower changes of the AC frequency may thus be measured. A harmonic disturbance test according to which the electrical test conditions comprise harmonic distortions an amount of which is varied by the test condition generator. The power of different orders of harmonic distortions may for example be adjusted, the fundamental frequency being the nominal operating frequency, such as 50 Hz or 60 Hz. For example, the contribution of the fifth order or any other harmonic to the AC power generated by the test condition generator may be varied between 0% and 10%. Different harmonics may contribute at the same time to the generated AC electrical power.

In an embodiment, the at least one power converter comprises a first power converter and a second power converter coupled in parallel to the generator, both of which provide in the respective power generating mode a conversion of electrical power generated by the generator. In other words, during normal operation of the wind turbine, i.e. in the power generating mode of the wind turbine, both converters operate the conventional way and form part of the wind turbine's electrical drive train. In the testing mode, at least the first electrical power converter is operated as the test condition generator. Such setup comprising two converters allows the performing of additional tests, since even when the wind turbine is disconnected from the power grid, the electrical conditions, in particular currents, on the grid side part of the wind turbine's electrical system can be varied over a wide range.

When having available such second power converter, exposing the electrical system to be tested to the predetermined electrical test conditions may comprise the performing of at least one of the following tests: a harmonic emission test according to which the electrical test conditions comprise harmonic distortions an amount of which is varied by the test condition generator, wherein the second power converter is operated in a normal operating mode (i.e. the power generating mode as during normal operation of the wind turbine). As outlined above, the contribution of different order harmonics may be adjusted in such test. Accordingly, the response of the second converter to such harmonic distortions when operating the normal way can be measured and validated. A current range test in which the second power converter is operated in a normal operating mode (i.e. the power generating mode) and the test condition generator is operated in a motor mode in which it supplies electrical power to the generator to rotate the generator. The current range test further includes varying the load constituted by the second test condition generator to generate varying current flows in the electrical system. In particular, different operating points with respect to the active and/or reactive power provided by the second power converter may thus be simulated by the electrical test conditions. For example, the test condition generator may draw high currents which need to be supplied by the second power converter, thus providing a respective current testing of the second power converter. As another example, the test condition generator may generate or consume a certain amount of reactive power, and the reaction of the second power converter to such reactive power demand can be measured and validated. A fault ride through test in which the second power converter is operated in a normal operating mode (i.e. in the power generating mode) and the test condition generator is operated in a motor mode in which it supplies electrical power to the generator to rotate the generator, and which comprises varying the load constituted by the test condition generator so as to simulate a fault condition, in particular an overvoltage event or an undervoltage event on the power grid. The test condition generator may for example cause the voltage on the grid side of the second power converter to rise or drop above/below a respective threshold for a certain amount of time, and the response of the electrical system, and in particular of the second power converter to such event can be measured.

In the above examples, the second power converter provides at its grid side output AC electrical power as in normal operation, and the test condition generator is operated in a motor mode in which it thus constitutes a load on the second power converter and in which it drives the generator rotation. This allows the electrical system of the wind turbine connected to the grid side of the first and second power converters to be tested for a variety of conditions, including the above-mentioned overcurrent conditions or high/low voltage conditions. The current range test may for example apply different steady state operating points and active/reactive power ramps to fully test the electrical system of the wind turbine. The fault ride through (FRT) test may for example include the replicating of different voltage profiles that correspond to realistic low/high voltage events. This allows measurement and evaluation of the converter fault response as well as the testing of the auxiliary system compatibility with such voltage profiles. Further, post fault behavior can be tested by means of a "pseudo dip" to obtain a full turbine FRT test response.

A testing protocol according to which the test condition generator is operated may specify one or a combination of the above tests. It may in particular specify the operating conditions of the test condition generator and how the electrical characteristics are to be varied in accordance with the respective test.

In an embodiment, the electrical system of the wind turbine comprises one, two or more transformers coupled between the at least one power converter and the power grid. In an exemplary embodiment, a first transformer is coupled between the first power converter and the power grid and a second transformer is coupled between the second power converter and the power grid. The grid side output of the two or more transformers may for example be connected and may be coupled to the power grid via the above-mentioned switch. In the testing mode, the one, two or more transformers may form part of the electrical system to be tested (e.g. by opening the switch towards the grid and operating at least one of the power converters as the test condition generator). The one, two or more transformers may thus be exposed to the test conditions and may undergo any of the above described testing. In particular, if two or more transformers are provided, the grid side output of which is coupled, the current flow through electrical system to be tested involves the transformers and can be controlled, so that the transformers can likewise be exposed to a plurality of different test conditions. Almost the complete electrical drive train of the wind turbine (i.e. generator—converter—transformer) can thus undergo testing. A switch (e.g. circuit breaker) may be provided between the transformer and the respective power converter. A transformer may in particular be provided for each power converter.

The at least one power converter may comprise semiconductor switches, such as IGBTs, that are controlled (for example by a converter controller) to provide a respective power conversion. The at least one power converter may for example comprise a grid side converter stage, a generator side converter stage, and a DC link coupling the grid side and generator side converter stages. When operated as a test condition generator, electrical power may in particular be provided to (and thus received by) the generator side converter stage of the power converter, e.g. from the generator. It may furthermore be configured to allow a bidirectional power flow, i.e. it may be capable of providing electrical power from the grid side towards the generator, or from the generator towards the grid side. The power converter may in particular implement a full converter solution. The generator is a permanent magnet synchronous generator (PMSG), yet it may also be an asynchronous induction generator, a DFIG, or the like. The power converter is in particular configured to provide conversion using pulse width modulation (PWM).

The at least one power converter in particular forms part of the electrical drive train of the wind turbine.

A further embodiment of the invention provides a test system for testing an electrical system of a wind turbine. The test system comprises at least one power converter of the wind turbine that is coupled to a generator of the wind turbine, wherein the at least one power converter is operable in a in a power generating mode in which the power converter provides a conversion of electrical power generated by the generator and provides a controllable output of AC electrical power towards a power grid. The test system further includes a control unit coupled to the at least one power converter and configured to control the operation of the at least one power converter. The control unit is further configured operate in a testing mode (in particular to operate the wind turbine in a testing mode) and to perform, in the testing mode, the steps of any of the methods described herein. The control unit thus in particular controls the power converter to operate as a test condition generator and to provide the electrical test conditions for testing the electrical system of the wind turbine. By such method, advantages similar to the ones outlined further above may be achieved.

A further embodiment of the invention provides a wind turbine comprising the above test system. The wind turbine may further comprise the generator, and may comprise the transformer. It may further comprise the further/second power converter. It may further comprise the electrical system, including any of the above-mentioned components.

According a further embodiment of the invention, a computer program for testing an electrical system of a wind turbine is provided. The computer program comprises control instructions which, when executed by a control unit of a test system of the wind turbine that is coupled to a power converter of the wind turbine, cause the control unit to perform any of the methods described herein. The computer program may be provided as a computer program product (non-transitory computer readable storage medium having instructions, which when executed by a processor, perform actions).

A further embodiment relates to a volatile or non-volatile storage medium that comprises the computer program, i.e. that comprises the respective control instructions.

It should be clear that the test system may be configured to perform any of the testing methods described herein, and may in particular comprise any of the components described in the context of such testing method. Further, the testing method may be performed by the test system in any of the configurations described herein. Also, steps of the testing method may be performed in a different order. For example, the power converter may first be supplied with electrical power and then operated as a test condition generator, and the electrical system may be decoupled from the power grid prior to that or thereafter.

It is to be understood that the features mentioned above and those yet to be explained below can be used not only in the respective combinations indicated, but also in other combinations or in isolation, without leaving the scope of embodiments of the present invention. In particular, the features of the different aspects and embodiments of the invention can be combined with each other unless noted to the contrary.

BRIEF DESCRIPTION

Some of the embodiments will be described in detail, with reference to the following figures, wherein like designations denote like members, wherein.

DETAILED DESCRIPTION

Figure 1:
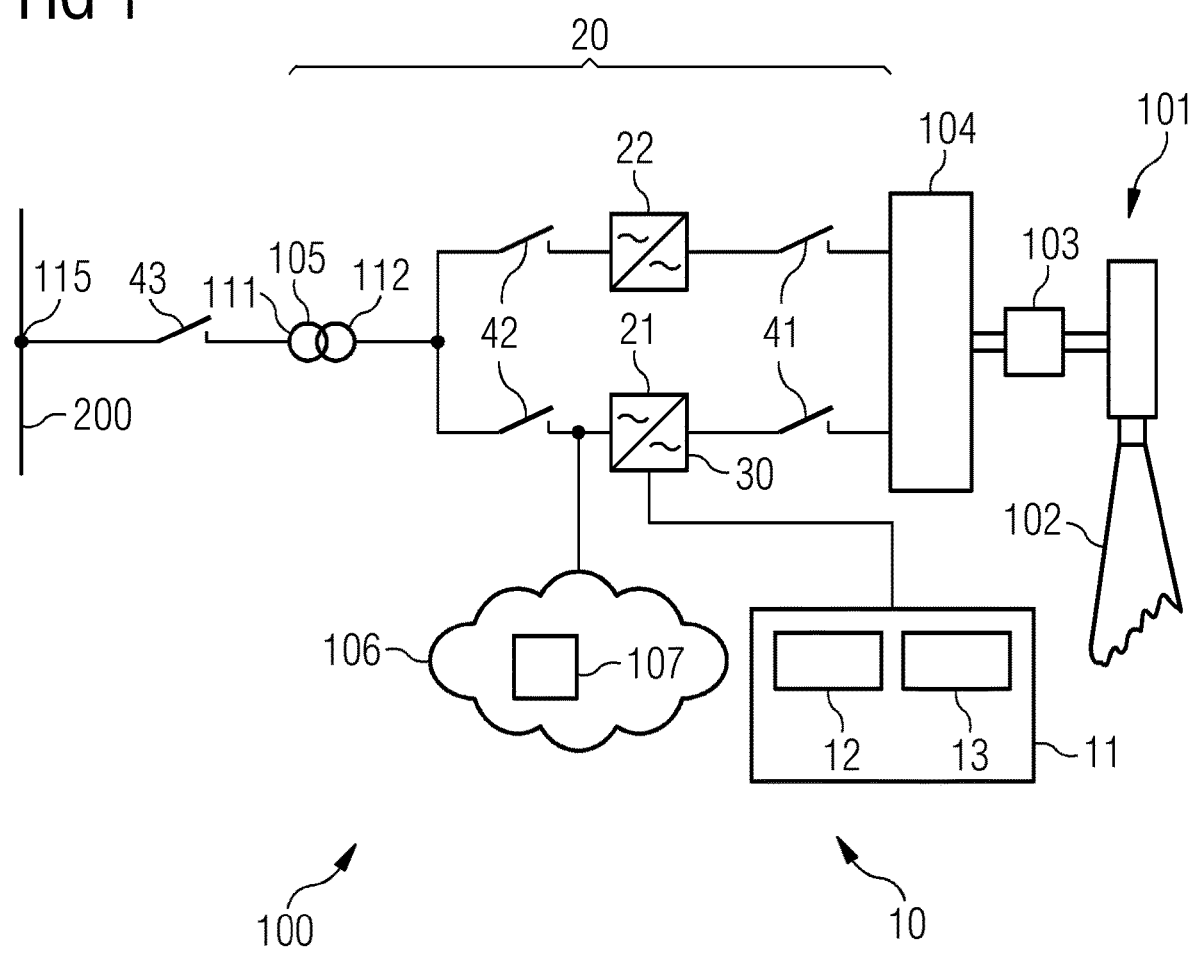
FIG. 1 is a schematic drawing showing a test system according to an embodiment of the invention.

In the following, embodiments of the invention will be described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that their function and general purpose become apparent to a person skilled in the art. As used herein, the singular forms "a," "an," and "the" are intended to include the plural forms as well, unless the context clearly indicates otherwise. The terms "comprising," "having," "including," and "containing" are to be construed as open-ended terms (i.e., meaning "including, but not limited to,") unless otherwise noted.

FIG. 1 shows schematically a test system 10 comprised in a wind turbine 100 that includes a wind turbine rotor 101 with rotor blades 102. Rotor 101 is coupled via a gearbox 103 to a generator 104, although in other configurations the wind turbine may be a direct drive wind turbine and may accordingly not include a gearbox 103. Generator 104 may be any type of generator, such as an induction generator (e.g. DFIG), or the like. The generator 104 is a permanent magnet synchronous generator (PSMG) that is directly driven by rotor 101. The electrical drive train of the wind turbine includes the generator 104 and the power converters 21, 22 which are AC to AC converters. It may further include the turbine transformer 105. Generator breakers 41 are provided and are operable to disconnect the power converters 21, 22 from generator 104. Net breakers 42 are furthermore provided and are operable to disconnect the first and second power converters 21, 22 from the wind turbine transformer 105 and thus from the power grid. Reference numerals 111 and 112 designate the transformer primary windings and secondary windings, respectively. A switch gear 43 is furthermore provided and is operable to connect or disconnect the wind turbine, in particular the transformer 105, from the power grid 200. Reference numeral 115 designates a respective power grid terminal where the wind turbine 100 is connected to power grid 200. Power grid 200 may be a public power grid, in particular a utility grid, or may be a local wind farm grid. It may for example be a medium voltage (1000 to 50,000 V) or a high voltage (above 50,000 V) grid, e.g. it may be operable at about 66 kV. Switch gear 43 may accordingly be a medium voltage or high voltage switch gear.

Wind turbine 100 furthermore includes the auxiliary system 106 that comprises several electric and electronic components required for the operation of the wind turbine 100. Auxiliary system 106 may for example include motors configured to drive components of the wind turbine, such as a yaw drive motor, a blade pitch drive motor, and the like. It may further include pumps, such as lubrication pumps; power supplies (e.g. for operating controllers or other system components); filters; protection systems; breakers and relays, in particular for motors and the like. Auxiliary system 106 may in particular include a turbine energy support system (TESS) that can provide backup power for keeping components of the auxiliary system 106 operational, for example during a power outage. TESS system 107 may accordingly include a power storage device, such as a battery. It may in particular provide the function of an uninterruptable power supply (UPS).

Wind turbine 100 is operable in a normal operating mode, in which the generator is rotated by rotor 101 and produces electrical power, which is converted by power converters 21, 22 to the desired AC frequency of power grid 200, and is supplied via the transformer 105 towards the power grid 200. Such mode of operation may be termed "power generating mode", as the wind turbine provides electrical power into the power grid 200, depending on the prevailing wind conditions. In such mode, the circuit breakers 41, 42 and the switch gear 43 are closed.

It should be clear that this is only an exemplary configuration of the wind turbine's electrical system, and that other configurations may be employed with embodiments of the present invention. For example, two main transformers 105 may be provided (each coupled to a converter), the transformer 105 may have two, three or more secondary windings, only one, or more than two (e.g. three, four or more) power converters may be provided, the power converters may be connected to separate transformer secondary windings, or the power converters 21, 22 may be connected to a common bus bar on the grid side, i.e. the low voltage side.

Each power converter 21, 22 may implement a full AC/AC converter and may accordingly comprise a grid side converter section connected via an intermediate DC link to a generator side converter section. In normal operation, the generator side converter section operates as a rectifier, rectifying the generated electrical power, and the grid side converter section operates as an inverter, generating AC electrical power at the required frequency from the DC electrical power received on the DC link (bus). Power converters 21, 22 may comprise respective semiconductor switches, such as IGBTS, performing the power conversion, for example according to a pulse width modulation (PWM) scheme. Power converters 21, 22 are accordingly capable of outputting on their grid side AC power having a controllable AC frequency and voltage magnitude. Further, power converters 21, 22 are capable of controlling the phase of the AC voltage and the active/reactive components of the output AC electrical power can be controlled.

The test system 10 includes a control unit 11 and the power converter 21, wherein control unit 11 controls the power converter 21. Control unit 11 may be a wind turbine controller, or may be implemented as a separate control unit. It may be coupled to a converter controller of power converter 21, or may implement such converter controller. Test system 10 is configured to provide testing for the electrical system 20 of the wind turbine, in particular for specific components thereof, depending on the configuration and the testing to be performed.

Control unit 11 may for example comprise a processing unit 12 and a memory 13 coupled to processing unit 12. Processing unit 12 may be implemented as a digital signal processor (DSP), application specific integrated circuit (ASIC), as a microprocessor or the like. Memory 13 may comprise flash memory, RAM, ROM, a hard disk drive and the like. Memory 13 stores control instructions, for example in the form of a computer program, which are executed by processor 12 and which, when executed, perform any of the testing methods disclosed herein. Control unit 11 may comprise further components, such as input/output interfaces, for example for receiving sensor signals for measuring the response of electrical components of wind turbine 100 to the testing conditions, and for providing control signals to the power converters 21, 22 or to other components of wind turbine 100. It may further include a user interface for receiving user input and for providing information, such as measurement results of the testing, to a wind turbine operator.

In FIG. 1, control unit 11 is shown to be coupled to the first power converter 21; it should be clear that it may likewise be coupled to the second power converter 22 to control the second power converter, or to any other wind turbine component to control the respective component or to receive measurement signals from such component, for example to the circuit breakers 41, 42 and the switch gear 43, to the auxiliary system 106 and to the TESS system 107.

Control unit 10 can operate the wind turbine 100 in a testing mode. An example of a respective method that can be performed by the control unit 11 is illustrated in the flow diagram of FIG. 5. When operating in the testing mode (step 51), the electrical system 20 to be tested is disconnected from the power grid 200, and the first power converter 21 is likewise disconnected from power grid 200 (step 52). The power converter 21 is now operated as a test condition generator (which may also be termed "laboratory signal generator"), wherein electrical power is supplied to the power converter 21 in step 53. By disconnecting the electrical system 20 to be tested from the power grid 200, the electrical system is no longer dependent or influenced by the external electrical power, such as the external voltage magnitude, frequency and harmonic distortion levels.

Figure 2:
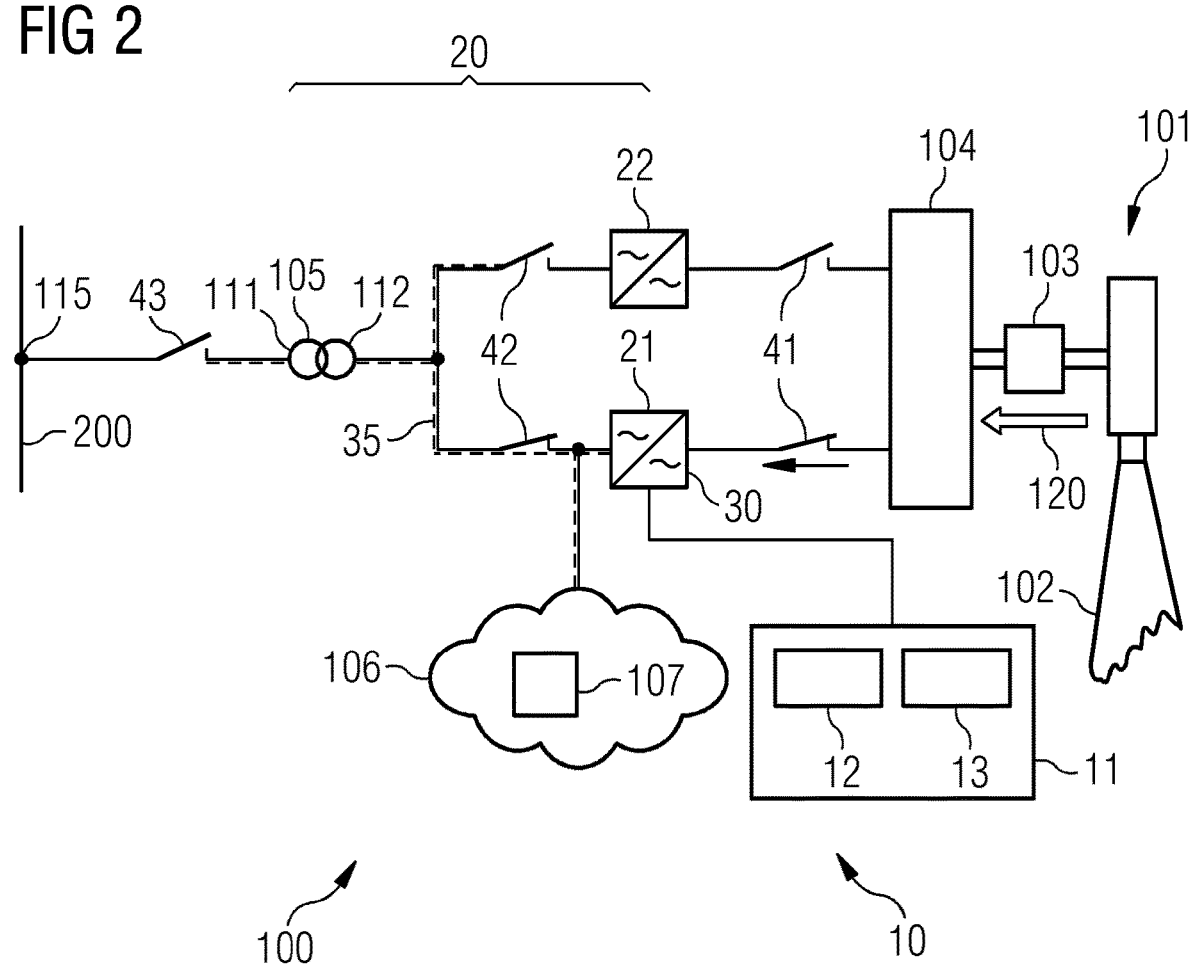
FIG. 2 is a schematic drawing showing the test system of FIG. 1 in a state in which a test of a wind turbine electrical system is performed.

FIG. 2 shows a first possibility of how the supply of electrical power to the power converter 21 can be implemented. The rotor 101 and thus the generator 104 are controlled by control unit 11 to rotate at a rotational speed that is higher than the minimum speed required to generate sufficient electrical power to cover the power consumption and the electrical losses in wind turbine 100. Wind turbine 100 is accordingly operational although it is disconnected (by opening switch gear 43) from power grid 200, as shown in FIG. 2. This corresponds to a self-sustain turbine operation. As indicated by arrow 120, rotational energy is provided to the generator 104, which in turn provides electrical energy (black arrow) to the first power converter 21. Converter 22 may be disconnected or may not be present.

Figure 3:
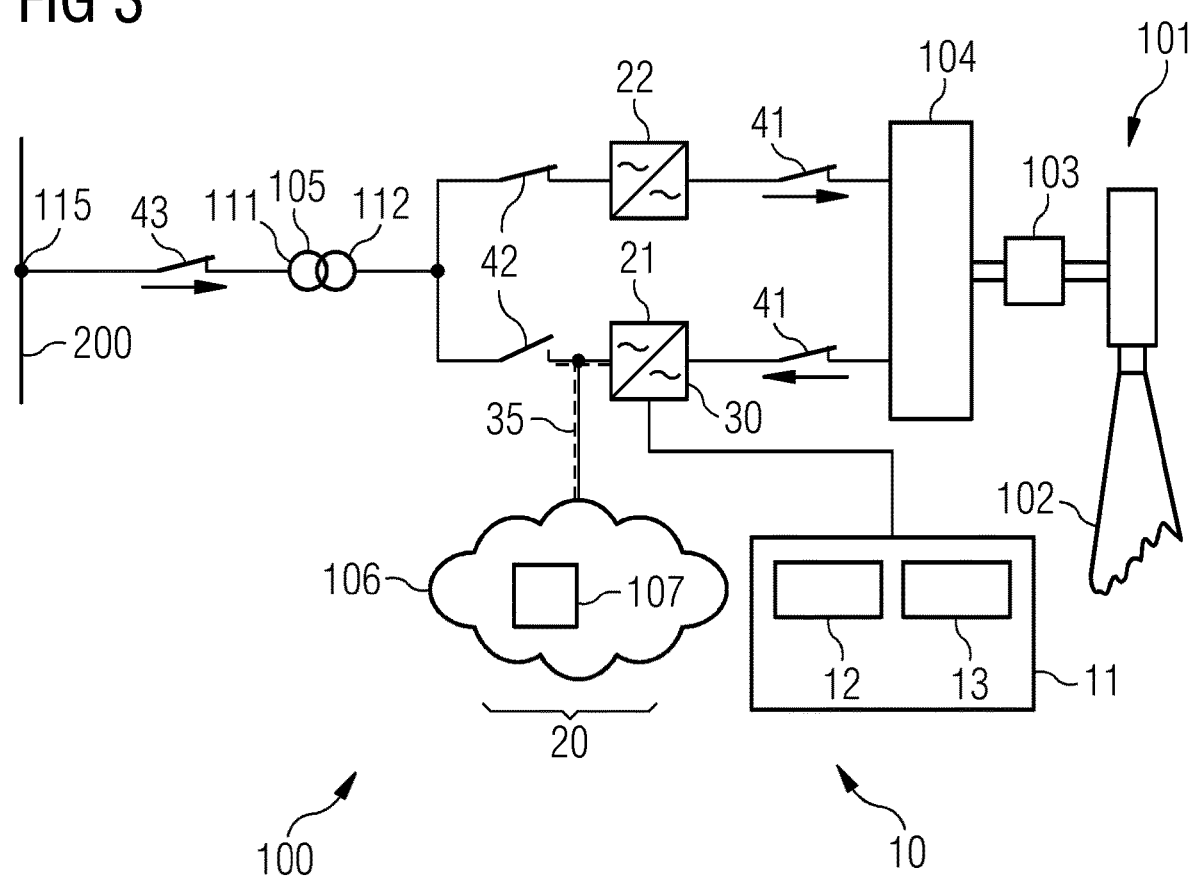
FIG. 3 is a schematic drawing showing the test system of FIG. 1 in a state in which a test of a wind turbine electrical system is performed, wherein power is supplied via a second power converter.

A second possibility of supplying the first power converter 21, and thus the test condition generator 30, with electrical power is shown in FIG. 3. In this example, the electrical system 20 to be tested as well as the power converter 21 are disconnected from power grid 200, in particular by opening the respective circuit breaker 42. The second power converter 22 is connected to power grid 200 via the closed switch gear 43. Converter 22 is operated in a reverse mode in which it receives electrical power from power grid 200 and provides converted electrical power to generator 104 to rotate the generator. The electrical power provided by converter 22 is thus exerting a positive torque on the generator 104 which rotates the generator, thus operating in a motor mode. Generator 104 is thus rotated with power from the power grid even if no wind is present. Operation of converter 22 may be performed under control of control unit 11. Converter 21 is operated in a conventional way and extracts energy from the generator 104, i.e. applies a negative torque on generator 104. Converter 21 and converter 22 may for example be coupled to different windings of generator 104, so that one power converter can operate in a motor mode to rotate the generator while the other receives electrical power from the generator. The power flow is indicated by black arrows in FIG. 3.

As another example, electrical power may be provided to the power converter 21 and thus to the test condition generator 30 from the TESS system 107 which includes an energy storage device. Depending on the battery capacity of the TESS system, the electrical system 20 of the turbine may be operated for a respective period of time. The latter two implementations allow the performing of the electrical system testing independent of the prevailing wind conditions. The test system is likewise operated under control of control unit 11.

Returning back to FIG. 5, the power converter 21 is then operated as the test condition generator 30 by converting the received electrical power to generate predetermined electrical test conditions. In particular, the grid side converter stage (i.e. the inverter part of power converter 21) is operated in a variable voltage variable frequency (VVVF) mode in which it generates at its grid side output an AC electrical power having a controllable AC voltage and frequency. The test condition generator 30 thus creates electrical test conditions that are controllable and to which the electrical components connected to the grid side 35 of the test condition generator 30 are exposed. The dashed lines in FIG. 2 referenced by numeral 35 indicate the part of the grid side electrical system of wind turbine 100 that is exposed to the electrical test conditions. The electrical system 20 to be tested thus includes in the example of FIG. 2 the auxiliary system 106, the turbine transformer 105, as well as the TESS system 107 (if available), the primary and secondary transformer windings and terminals 111, 112, and other electrical components of wind turbine 100 connected to the grid side part 35 of the electrical system. The respective components are thus energized by the AC electrical power produced by test condition generator 30.

FIG. 3 likewise indicates with dashed lines the grid side part of the electrical system that is exposed to the electrical test conditions. In FIG. 3, only the auxiliary system 106 and, if available, the TESS system 107 are exposed.

To fully test the electrical system 20, the test condition generator 30, under control of control unit 11, controls one or more electrical characteristics of the electrical test conditions (step 55). FIG. 6 shows in steps 61 and 62 a particular implementation of steps 54 and 55 of FIG. 5, which may be performed in the test system configurations of FIGS. 2 and 3. In step 61, the grid side converter stage of the test condition generator (i.e. the net inverter) generates an AC voltage and supplies the AC voltage to the electrical system connected to the output of the test condition generator 30, i.e. to the grid side part 35 of the wind turbine electrical system. In step 62, in accordance with a test to be performed, the test condition generator varies under control of control 11 the AC frequency and/or AC voltage and/or AC current and/or AC phase and/or harmonic distortions of the AC electrical power provided by test condition generator 30.

Such test and variation of the one or more characteristics may for example be performed in accordance with a respective testing protocol that is carried out by control unit 11. In the testing mode, a frequency range testing may for example be performed. The test condition generator 30 controls the frequency of the generated AC voltage (in particular of the fundamental voltage) according to a preset profile, which may in particular be set such that a full testing of the electrical system 20 is achieved. The frequency may for example be varied around a nominal operating frequency, such as 50 Hz or 60 Hz, for example within a frequency range of ±10% or ±20% of the nominal operating frequency.

In the testing mode, a voltage range testing may be performed in which the voltage magnitude of the generated AC voltage (in particular of the fundamental voltage) is controlled, e.g. according to a preset profile that ensures full testing of the electrical systems. For example, the voltage may be varied around a nominal operating voltage (such as 690 V), e.g. within 20% of such nominal operating voltage. It should be clear that different wind turbines may have different nominal operating voltages, and the above is only a non-limiting example.

In the testing mode, a phase jump testing may further be performed according to which a phase angle of the generated AC voltage (in particular of the fundamental voltage) is controlled, in particular in accordance with a preset profile that ensures a full testing of the connected electrical systems. The test condition generator 30 may produce a phase jump, in particular a discrete jump, for example by providing a sudden phase shift of a predetermined number of degrees, such as less than 30 degrees.

As another example, operation in the testing mode may include the performing of a rate of change of frequency testing wherein the rate at which the frequency of the generated AC voltage changes is controlled by the test condition generator 30. Again, this may occur according to a preset profile that achieves a desired full testing of the electrical system 20.

As another example, operating in the testing mode may include the performing of a harmonic compatibility test wherein the output of the test condition generator (i.e. the PWM output of the grid side converter stage) is controlled to generate predetermined harmonic distortions. Such harmonic distortions may for example occur at a multitude of the nominal operating frequency, such as 50 or 60 Hz, and the test condition generator 30 may generate one or a combination of different higher order harmonics. The contribution (power) of the different order harmonics to the generated AC voltage may then be varied by the test condition generator 30. Again, this may occur in accordance with a respective profile to fully test the electrical system 20.

As can be seen, there are several possibilities of how electrical test conditions can be generated and how the one or more electrical characteristics can be varied. It should be clear that such tests may be performed subsequently, or may be performed simultaneously (e.g. combining voltage and frequency variations or the like). These tests may be performed under control of control unit 11. The testing protocol may specify the testing to be performed so that a desired testing (i.e. the above-mentioned full testing) is achieved.

Turning back to FIG. 5, during the performing of the respective tests, the response of the tested electrical system 20 to the test conditions is monitored in step 56. This may include that respective measurement equipment (not shown) is connected to the components of electrical system 20 to be tested. Such measurement equipment is commonly known and thus not explained in greater detail here. It may also be monitored how certain protection systems behave, e.g. weather circuit breakers or relays are triggered in response to the test conditions.

After the tests have been completed, the wind turbine may then operate in the power generating mode (step 57), wherein the power converter 21, 22 provides conversion of electrical power generated by generator 104. This involves closing of the respective circuit breakers 41, 42 and switch gear 43 to couple wind turbine 100 to power grid 200. Wind turbine 100 is thus an installed and grid connected wind turbine. It may for example be an offshore wind turbine. Accordingly, wind turbine 100 can be tested without requiring additional test equipment for generating desired test conditions, and without disassembling the wind turbine, for example by removing the nacelle.

If the wind turbine 100 comprises a second power generator 22, further possibilities of testing can be provided. For example, operation in the testing mode may comprise the performing of a harmonic emission testing, wherein the second converter 22 is operated in a normal operating mode, thus converting electrical power received from generator 104 in the conventional way. The test condition generator 30 then generates on its grid side output AC electrical power comprising respective harmonic distortions. As indicated above, different percentages of higher order harmonics may be introduced by the test condition generator 30 into the generated AC voltage. It can then be tested how the second power converter 22 that operates in the normal mode reacts to such harmonic distortions (step 56).

Figure 5:
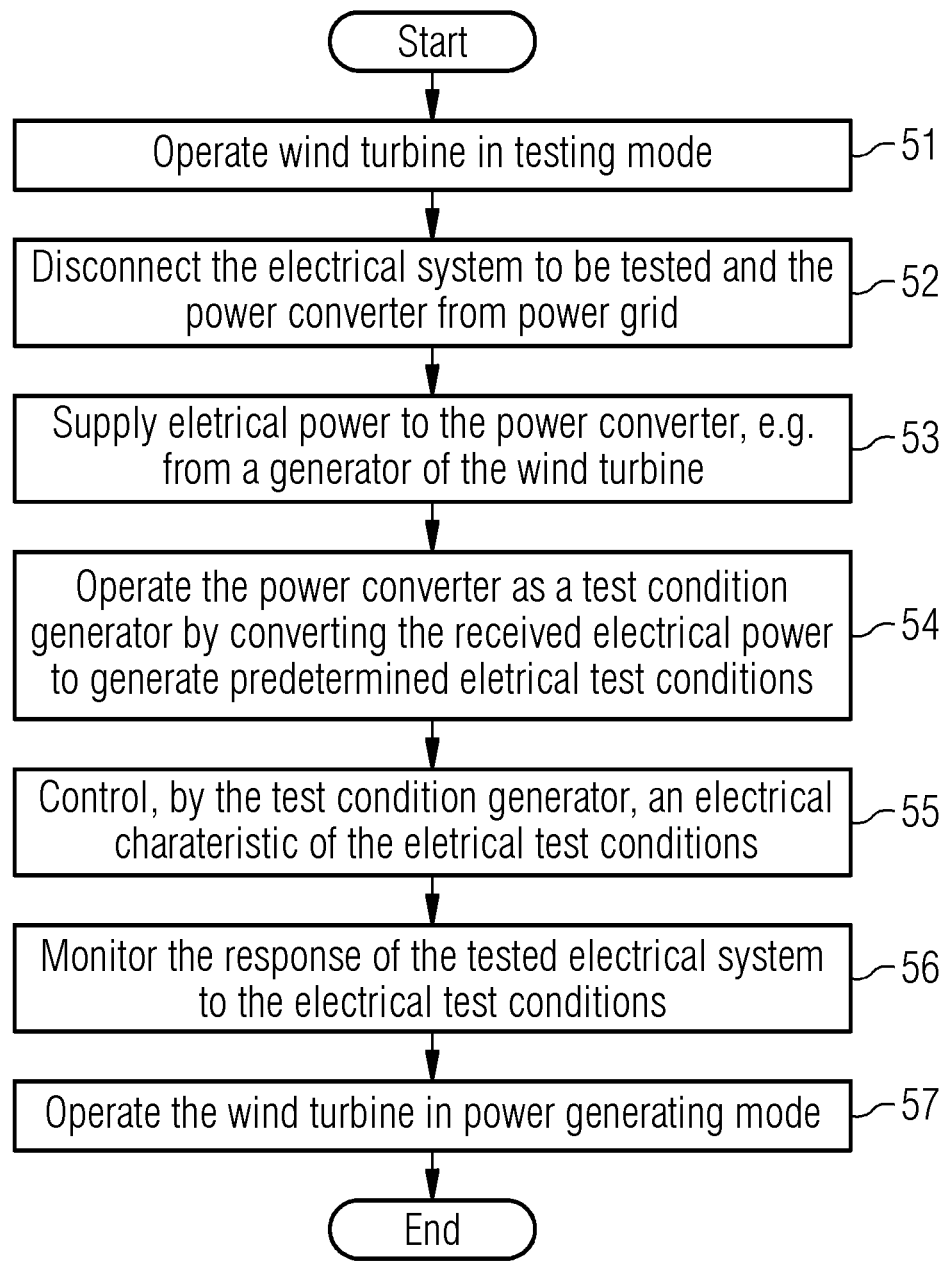
FIG. 5 is a schematic flow diagram illustrating a method according to an embodiment of the invention.
Figure 6:
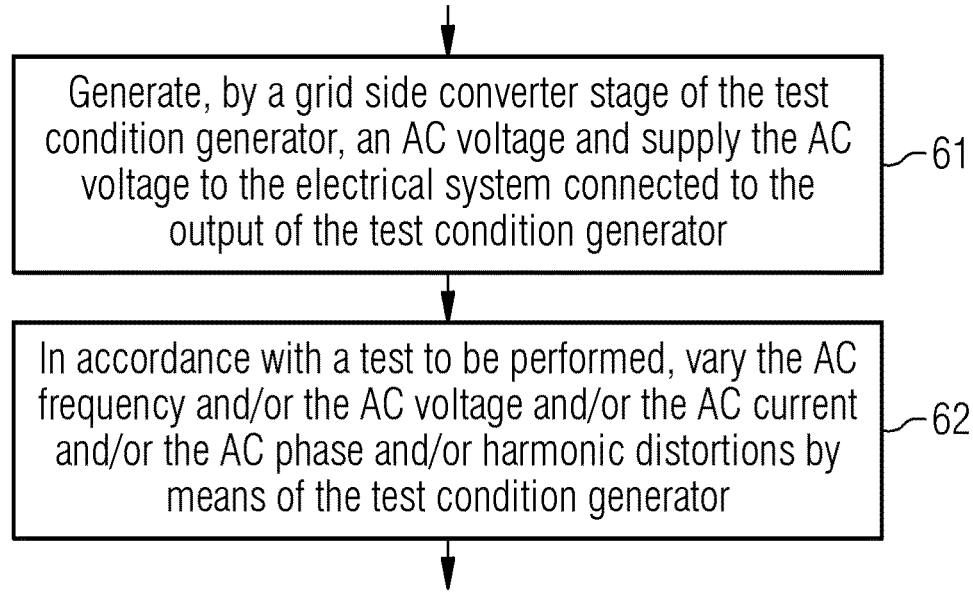
FIG. 6 is a schematic flow diagram illustrating a method according to an embodiment of the invention.
Figure 7:
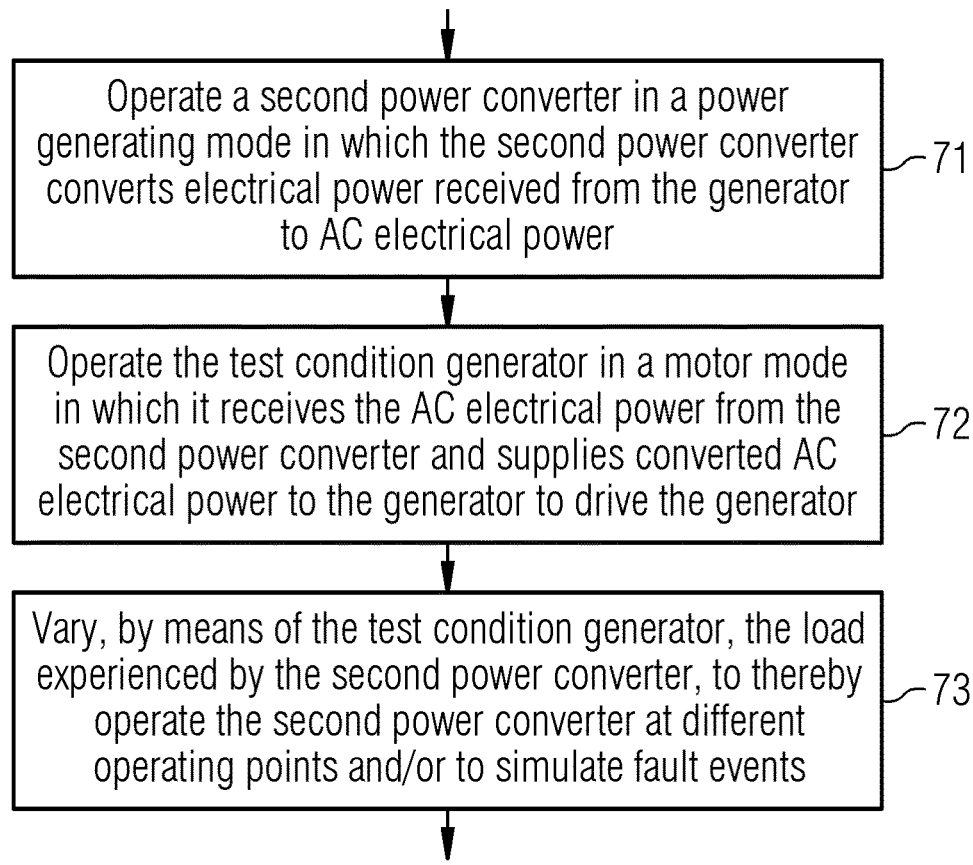
FIG. 7 is a schematic flow diagram illustrating a method according to an embodiment of the invention.

FIG. 7 illustrates another possibility of implementing steps 54 and 55 of FIG. 5. In step 71, the second power converter 22 is operated in a power generating mode (i.e. normal operation) in which it converts the electrical power received from generator 104 to AC electrical power. The test condition generator 30 is then operated in a motor mode in which it receives the AC electrical power from the second power generator 22 and supplies converted AC electrical power to the generator 104 to thereby drive the generator (i.e. rotate the generator in correspondence to a motor). Again, converters 21, 22 may be coupled to different generator windings for such operation (step 72). The test condition generator 30 may simulate certain conditions that are experienced by the second power converter 22 operating the normal way. In step 73, test condition generator 30 varies the load experienced by the second power converter 22, thereby causing the second power converter 22 to operate at different operating points, and/or to simulate fault conditions or events. The test condition generator 30 thus generates the test condition at its input during such test.

Figure 4:
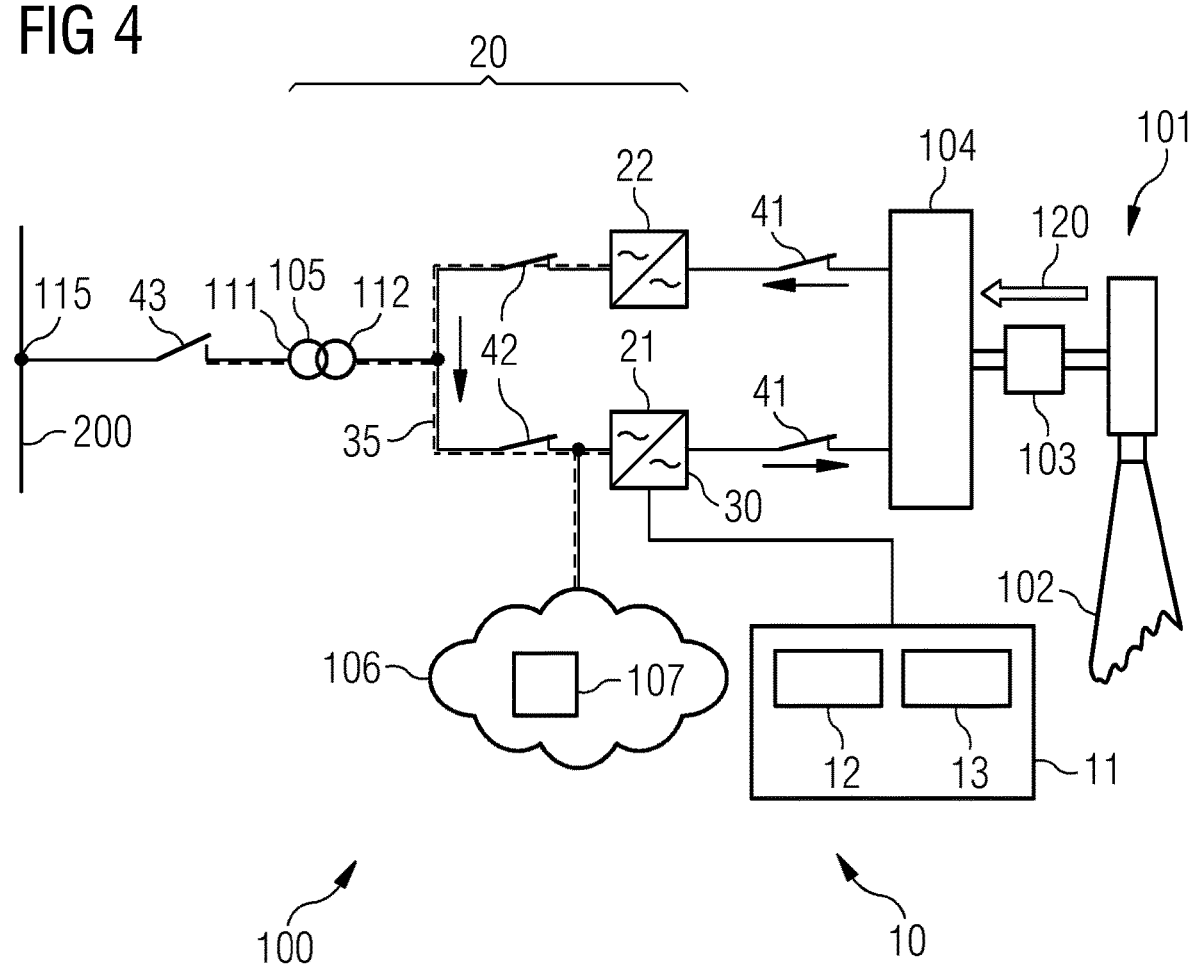
FIG. 4 is a schematic drawing showing the test system of FIG. 1 in a state in which a test of a wind turbine electrical system is performed, wherein the test condition generator is operated in a motor mode.

A respective situation is illustrated in FIG. 4, wherein the wind turbine is disconnected from power grid 200 (via switch gear 43), wherein breakers 41, 42 are closed. The electrical power flow is indicated with black arrows in FIG. 4. Power for operating the wind turbine 100 while being disconnected from the power grid is again supplied from the rotor 101 (arrow 120), or may be provided by the TESS-system 107. For testing, the second converter 22 is operated at the full current rating, and should accordingly have the full power available. For this purpose, the current is circulated in the electrical system, as indicated by arrows. Converter 22 thus extracts electrical power from the generator 104, while the test condition generator 30 drives the generator 104. Accordingly, the current level in the electrical system part 35 that is exposed to the test conditions can be varied over a substantial operating range.

Operation in the testing mode may accordingly comprise the performing of a current range test in which different operating states and conditions are set by the test condition generator 30 under control of control unit 11. This may include different steady state operating points at different current levels and different power factors (ratio of active and reactive power) in the grid side part 35 of the electrical system. Furthermore, during such testing, active and reactive power ramps may be applied to test the electrical system 20. It should be clear that not only the second power converter 22 is exposed to such test conditions, but also the other components of the wind turbine connected to the grid side part 35 of the electrical system in which the testing conditions prevail. The test condition generator 30 may for example be controlled so as to generate or consume reactive power, thereby adjusting the operating point.

Operation in the testing mode may furthermore include the performing of a fault ride through test. Test condition generator 30 for example simulates a fault condition, it may in particular replicate a voltage profile corresponding to a realistic low voltage or high voltage event as may occur on the power grid 200. By such testing, the response of the second power converter, in particular of its grid side converter section (i.e. net inverter) can be monitored, and the compatibility of the remaining electrical systems with such fault conditions can be tested. Test condition generator 30 may for example cause a voltage dip in the grid side part 35 of the electrical system (e.g. by drawing a respective amount of current above the nominal operating limits of the second power converter 22). Upon such event, the second converter 22 tries to respond in the usual manner, in particular by trying to pull up the voltage to the nominal level. Consequently, the reaction of the second converter 22 to such fault condition can be monitored. It should be clear that adjusting the characteristics may include adjusting the time and magnitude of a respective over-voltage/under-voltage condition. Also, the post-fault behavior may be tested by means of such pseudo dip in the voltage generated by the test condition generator.

Again, these above tests may be performed so that a desired testing of the wind turbine electrical system is provided, in particular a full turbine test as required by the respective grid code. The tests and the testing parameters, such as the setting and variation of the one or more characteristics of the electrical test conditions, may be defined in a respective testing protocol. The tests described with respect to FIGS. 4 and 7 may be performed simultaneously or subsequently, and may furthermore be combined with the tests described with respect to FIGS. 2, 3 and 6.

Figure 8:
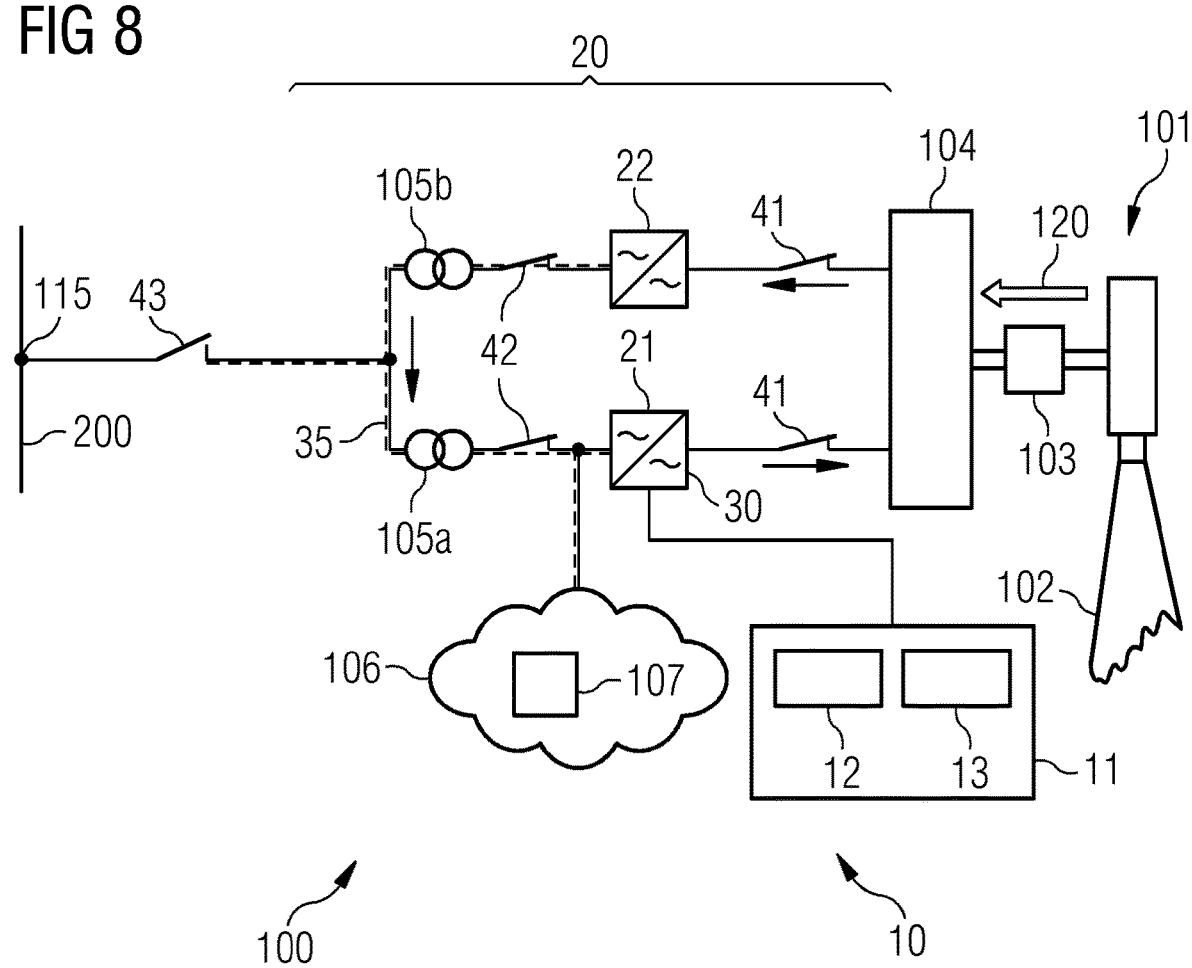
FIG. 8 is a schematic drawing showing the test system of FIG. 1 in the state of FIG. 4, wherein a separate transformer is provided for each power converter.

In the examples described above with respect to FIGS. 1-4, only a single transformer is coupled between the one, two or more power converters 21, 22 and the power grid 200. Further transformers may be provided. For example, as shown in FIG. 8, instead of a single transformer 105, a first transformer 105a can be provided for the power converter 21 and a second transformer 105b can be provided for the power converter 22, each of which are operable to transform electrical power provided by the respective power converter in the power generating mode. The output of the transformers is connected together and coupled via switch 43 to the power grid 200. In the testing mode, both transformers can be exposed to the respective test conditions. The testing mode of FIG. 8 corresponds to the one of FIG. 4. Accordingly, the above explanations equally apply to FIG. 8. As can be seen, the transformers 105a, 105b are now exposed to the current flow through the electrical system 20 to be tested, and can thus fully be tested. In particular, almost the complete electrical drive train of the wind turbine 100 can be tested by such arrangement. Further transformers can be provided for further power converters.

The wind turbine may be switched, by the control unit 11, from a normal operating mode (power generating mode) into the testing mode. The wind turbine may also be started-up in a testing mode. For example, the wind turbine may be started-up while being connected to the power grid 200, so that power is available and can be supplied to the wind turbine systems during start-up. As described with respect to FIG. 3, the speed of the wind turbine rotor 101 can be controlled during start-up of the wind turbine to a speed sufficient to generate enough power for operating the wind turbine. Once sufficient electrical power is generated, the power supply from the power grid 200 can be ramped down to zero and the wind turbine systems can be supplied from generator 104. Switch gear 43 is then opened to isolate the turbine electrical system from power grid 200 (corresponding to step 52 of FIG. 5). The electrical system is then brought into the condition for testing, for example by opening/closing the respective circuit breakers and operating the power converter 21 as a test condition generator that is being supplied with electrical power from generator 104. The above outlined tests can then be performed in the testing mode.

Alternatively, if a TESS system 107 is present, the energy required during the start-up of the wind turbine can be supplied from TESS system 107, so that the switch gear 43 can already be opened prior to starting-up the wind turbine in the testing mode, i.e. the switch gear does not need to be operated during start-up. As a further alternative, an external system, such as a battery bank or a diesel generator, may be brought to the wind turbine 100 and may be used to provide electrical energy for starting-up the wind turbine in the testing mode. Again, a grid connection is not required for starting-up the wind turbine in the testing mode.

In any case, the grid side part 35 of the electrical system of the wind turbine is electrical disconnected from the power grid 200 and can thus be operated at voltages and frequencies determined by the test condition generator 30. It should also be clear that the generator side part of the electrical system (i.e. the part between the power converters 21, 22 and the generator 104), is electrically independent from the power grid 200 and can thus be operated at desired voltages and frequencies.

By means of such testing method and test system, no additional equipment for testing, in particular for providing the electrical test conditions, is required. Accordingly, test costs can be lowered and the flexibility of testing can be increased. Further, this may result in a reduced time to market for a prototype wind turbine. By disconnecting the system to be tested from the power grid, properties and characteristics can be tested that are incompatible with the power grid such as alternative AC frequencies, phase jump events, fast rate of change of frequency (ROCOF) events, grid fault events, such as high voltage and low voltage events and the like. Further, the method and system allows the performing of electrical system tests at any turbine at any time. In particular, a wind turbine that is already operational, and that is for example upgraded can be tested or re-tested. Tests may for example be performed for alternative components of the wind turbine (to detect the influence of such components on the electrical operating conditions). Also, changed specifications and country-specific configurations can easily be tested. Furthermore, fault diagnosis may be facilitated. For example, if a particular event has occurred on a site where the wind turbine is installed, such as a grid event, it becomes possible to simulate (i.e. replay) the characteristics of such grid event on a single wind turbine. The response of the wind turbine can thus be monitored. Also, solutions for reacting to such events can be tested and can be documented onsite. Conclusions drawn from such event may be verified by the respective testing.

Although the present invention has been disclosed in the form of embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method of testing an electrical system of a wind turbine, wherein the wind turbine comprises at least one power converter coupled to a generator of the wind turbine, the at least one power converter is operable in a power generating mode in which the at least one power converter provides a conversion of electrical power generated by the generator and provides a controllable output of AC electrical power towards a power grid, the method comprising:
   operating the wind turbine in a testing mode, wherein the operating in the testing mode comprises:
      decoupling the electrical system to be tested from the power grid;
      operating the at least one power converter as a test condition generator;
      supplying electrical power to the test condition generator;
      converting, by the test condition generator, the received electrical power to generate predetermined electrical test conditions, and
      exposing the electrical system to be tested to the predetermined electrical test conditions,
   wherein the test condition generator controls one or more electrical characteristics of the electrical test conditions.

2. The method according to claim 1, wherein the test condition generator converts the received electrical power into AC electrical power, wherein the test condition generator controls the one or more electrical characteristics of the electrical test conditions by operating as an AC power source and controlling one or more electrical characteristics of the converted AC electrical power, and/or by operating as an AC load and controlling one or more load characteristics.

3. The method according to claim 1, wherein the one or more electrical characteristics of the electrical test conditions include one or a combination of an AC frequency, an AC voltage magnitude, an AC current magnitude, a phase angle of an AC voltage and/or AC current, a rate of change of the AC frequency, a magnitude of one or more harmonic distortions, and a phase angle of one or more harmonic distortions.

4. The method according to claim 1, wherein the electrical power is supplied to the test condition generator by generating the electrical power using the generator of the wind turbine, or by a turbine energy support system, TESS, comprising an energy storage device, or by an external power system.

5. The method according to claim 1, wherein the electrical power is supplied to the test condition generator by generating the electrical power using the generator of the wind turbine, wherein the generator is rotated by receiving rotational mechanical energy from a rotor of the wind turbine, or wherein the generator is rotated by electrical power received from the power grid via a further electrical power converter connected in parallel to the test condition generator to the generator of the wind turbine.

6. The method according to claim 1, wherein the step of decoupling the electrical system to be tested from the power grid comprises decoupling the test condition generator from the power grid, wherein the decoupling comprises opening a switch between a transformer of the wind turbine and the power grid.

7. The method according to claim 1, further comprising starting the wind turbine in the testing mode by:
   obtaining electrical power from a power source, wherein the power source is at least one of the power grid, a turbine energy support system of the wind turbine or an external power source;
   starting up the wind turbine by means of the obtained electrical power and controlling a rotational speed of a rotor of the wind turbine such that electrical power to operate the wind turbine is generated by the generator of the wind turbine;
   if the wind turbine is coupled to the power grid, decoupling the wind turbine from the power grid, thereby decoupling the electrical system to be tested from the power grid; and
   supplying the electrical power generated by the generator to the test condition generator.

8. The method according to claim 1, wherein the electrical system to be tested comprises one or a combination of wind turbine components selected from the group consisting of: a wind turbine auxiliary system, a wind turbine transformer, circuit breakers or relays of the wind turbine electrical system, an electrical power converter, a turbine energy support system, a wind turbine protection system, a wind turbine auxiliary power supply, a wind turbine motor, and a wind turbine pump.

9. The method according to claim 1, further comprising monitoring a response of the electrical system to be tested to the electrical test conditions.

10. The method according to claim 1, wherein the electrical system of the wind turbine comprises two or more transformers coupled between the at least one power converter and the power grid, wherein a first transformer is coupled between a first of the at least one power converter and the power grid and a second transformer is coupled between a second of the at least one power converter and the power grid.

11. The method according to claim 1, wherein exposing the electrical system to be tested to the predetermined electrical test conditions comprises performing:
   a frequency range test according to which the electrical test conditions comprise an AC voltage the AC frequency of which is varied by the test condition generator around a nominal operating frequency of the electrical system to be tested;
   a voltage range test according to which the electrical test conditions comprise an AC voltage the magnitude of which is varied by the test condition generator around a nominal operating voltage of the electrical system to be tested;
   a phase jump test according to which the electrical test conditions comprise exposure to an AC voltage and/or AC current a phase angle of which is varied by the test condition generator by introducing a phase jump;
   a frequency change rate test according to which the electrical test conditions comprise an AC voltage the rate of change of an AC frequency of which is varied by the test condition generator; or
   a harmonic disturbance test according to which the electrical test conditions comprise harmonic distortions, wherein an amount of harmonic distortions is varied by the test condition generator.

12. The method according to claim 1, wherein the at least one power converter comprises a first power converter and a second power converter coupled in parallel to the generator, which, in the respective power generating mode, provide a conversion of electrical power generated by the generator, wherein in the testing mode, at least the first electrical power converter is operated as the test condition generator.

13. The method according to claim 12, wherein exposing the electrical system to be tested to the predetermined electrical test conditions comprises performing:
   a harmonic emission test according to which the electrical test conditions comprise harmonic distortions, wherein an amount of harmonic distortions is varied by the test condition generator, wherein the second power converter is operated in a normal operating mode;
   a current range test in which the second power converter is operated in the normal operating mode and the test condition generator is operated in a motor mode in which the test condition generator supplies electrical power to the generator to rotate the generator, and which comprises varying the load constituted by the test condition generator to generate varying current flows in the electrical system to be tested; or
   a fault ride through test in which the second power converter is operated in the normal operating mode and the test condition generator is operated in the motor mode in which the test condition generator supplies electrical power to the generator to rotate the generator, and which comprises varying the load constituted by the test condition generator so as to simulate an overvoltage event and/or an undervoltage event on the power grid.

14. A test system for testing an electrical system of a wind turbine, wherein the test system comprises at least one power converter of the wind turbine that is coupled to a generator of the wind turbine, wherein the at least one power converter is operable in a power generating mode in which the at least one power converter provides a conversion of electrical power generated by the generator and provides a controllable output of AC electrical power towards a power grid, and a control unit coupled to the at least one power converter and configured to control an operation of the at least one power converter, wherein the control unit is further configured operate in a testing mode by performing the steps of:
   decoupling the electrical system to be tested from the power grid;
   operating the at least one power converter as a test condition generator;
   supplying electrical power to the test condition generator;
   converting, by the test condition generator, the received electrical power to generate predetermined electrical test conditions;
   exposing the electrical system to be tested to the predetermined electrical test conditions; and
   controlling one or more electrical characteristics of the electrical test conditions by means of the test condition generator.

15. A computer program product, comprising a computer readable hardware storage device having computer readable program code stored therein, the program code executable by a processing unit of a control unit of a test system of the wind turbine that is coupled to a power converter of the wind turbine, causing the control unit to perform the method of claim 1.

* * * * *